(12) United States Patent
Hubbard et al.

(10) Patent No.: US 7,303,941 B1
(45) Date of Patent: Dec. 4, 2007

(54) METHODS AND APPARATUS FOR PROVIDING A POWER SIGNAL TO AN AREA ARRAY PACKAGE

(75) Inventors: Kenneth Hubbard, San Jose, CA (US); Jie Xue, Andover, MA (US); Yida Zou, San Jose, CA (US); Zhiping Yang, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 1 day.

(21) Appl. No.: 10/799,479

(22) Filed: Mar. 12, 2004

(51) Int. Cl.
*H01L 21/44* (2006.01)

(52) U.S. Cl. .................. 438/107; 438/109; 438/612; 438/614

(58) Field of Classification Search .............. 257/686, 257/691, 738, 775–780, 666; 438/108, 612, 438/613, 638, 107, 109, 614
See application file for complete search history.

(56) References Cited

U.S. PATENT DOCUMENTS

| | | | |
|---|---|---|---|
| 3,871,015 A * | 3/1975 | Lin et al. ................... 257/779 |
| 5,214,308 A * | 5/1993 | Nishiguchi et al. .......... 257/692 |
| 5,701,032 A * | 12/1997 | Fischer et al. ............. 257/692 |
| 5,748,456 A | 5/1998 | Bayerer ..................... 361/820 |
| 5,757,078 A * | 5/1998 | Matsuda et al. ............ 257/737 |
| 5,760,478 A * | 6/1998 | Bozso et al. ................ 257/777 |
| 5,828,128 A * | 10/1998 | Higashiguchi et al. ....... 257/738 |
| 6,147,401 A * | 11/2000 | Solberg ....................... 257/723 |
| 6,396,136 B2 * | 5/2002 | Kalidas et al. .............. 257/691 |
| 6,437,439 B1 * | 8/2002 | Shimoe ....................... 257/734 |
| 6,444,563 B1 * | 9/2002 | Potter et al. ................ 438/615 |
| 6,452,113 B2 | 9/2002 | Dibene, II et al. .......... 174/260 |
| 6,476,503 B1 * | 11/2002 | Imamura et al. ............ 257/780 |
| 6,477,046 B1 * | 11/2002 | Stearns et al. .............. 361/704 |
| 6,525,275 B1 * | 2/2003 | Asai .......................... 174/255 |
| 6,552,436 B2 * | 4/2003 | Burnette et al. ............. 257/777 |
| 6,584,596 B2 | 6/2003 | Buffet et al. .................. 716/1 |
| 6,597,593 B1 | 7/2003 | Cruz et al. .................. 363/147 |
| 6,600,220 B2 * | 7/2003 | Barber et al. ............... 257/685 |
| 6,627,822 B2 * | 9/2003 | Jackson et al. ............. 174/260 |
| 6,657,311 B1 * | 12/2003 | Hortaleza et al. ........... 257/778 |
| 6,674,166 B2 * | 1/2004 | Rao et al. ................... 257/738 |
| 6,750,135 B2 * | 6/2004 | Elenius et al. .............. 438/615 |
| 6,750,549 B1 * | 6/2004 | Chandran et al. ........... 257/780 |
| 6,770,963 B1 | 8/2004 | Wu ............................ 257/691 |
| 6,773,269 B1 | 8/2004 | Downes ....................... 439/75 |
| 6,787,920 B2 * | 9/2004 | Amir .......................... 257/778 |
| 6,867,502 B2 * | 3/2005 | Katagiri et al. ............. 257/778 |
| 6,897,555 B1 * | 5/2005 | Lim et al. ................... 257/692 |
| 6,927,346 B2 * | 8/2005 | McCormick et al. ........ 174/260 |

* cited by examiner

*Primary Examiner*—Wai-Sing Louie
(74) *Attorney, Agent, or Firm*—BainwoodHuang

(57) ABSTRACT

An area array device has a grid array of primary electrical contacts coupled to a coupling surface of the device and configured to carry data signals between the area array package and a circuit board. The area array device also has an additional series of secondary electrical contacts coupled to the coupling surface of the device and configured to carry power signals between the area array package and the circuit board. The additional series of secondary electrical contacts provides a relatively large amount of power to the area array package while allowing a manufacturer to maintain the number of primary electrical contacts of the grid array configured to carrying data signals and therefore maintain the overall performance of the area array package.

10 Claims, 3 Drawing Sheets

METHODS AND APPARATUS FOR PROVIDING A POWER SIGNAL TO AN AREA ARRAY PACKAGE

BACKGROUND

Conventional circuit board components, such as area array packages, have an array of electrical contacts located on an attachment surface of the circuit board component (e.g., a surface of the circuit board component that attaches to a circuit board). The array of electrical contacts of the area array package electrically and mechanically couple to contact pads located on the circuit board to allow electrical communication between the package and the circuit board. For example, in one arrangement, the area array package is configured as a ball grid array (BGA) device having solder balls forming the electrical contacts of the array. In another arrangement, the area array package is configured as a ceramic column grid array (CCGA) device having solder columns forming the electrical contacts of the array.

The attachment surface of conventional area array devices, such as an application specific integrated circuit (ASIC), has a relatively small surface area (e.g., 2025 mm$^2$). The conventional ASIC utilizes an array of solder balls having a ball diameter of 0.65 mm, thereby allowing placement of a relatively large number of solder balls on the attachment surface of the ASIC. In the array, the solder balls are distributed across the attachment surface of the ASIC in an array pattern of 50 columns having 50 solder balls per column. Such an array or grid configuration (50×50) results in 2500 solder balls in the array for mechanical attachment of the ASIC to the circuit board (e.g., attachment to the contact pads of the circuit board) and for electrical contact between the ASIC and the circuit board.

In a typical solder ball array, the solder balls of the ASIC allow transmission of data signals between the circuit board and the ASIC and allow transmission of power supply signals from the circuit board to the ASIC in order to power the ASIC during operation. Approximately 40-50% of the solder balls (e.g., 1000-1250 solder balls) of the conventional solder ball array are configured for carrying power supply signals from the circuit board to the ASIC. Approximately 50-60% of the remaining solder balls (e.g., 1250-1500 solder balls) of the conventional solder ball array, therefore, are configured to carry data signals between the circuit board and the ASIC.

SUMMARY

Conventional techniques for providing an exchange of power signals and data signals between an area array package and a circuit board suffer from a variety of deficiencies.

As described above, the solder ball array of a conventional ASIC carries data signals between the circuit board and the ASIC and power supply signals from the circuit board to the ASIC in order to power the ASIC during operation. Approximately 40-50% of the solder balls (e.g., 1000-1250 solder balls) of the solder ball array are configured for carrying (e.g., transmitting and grounding) power supply signals between the circuit board and ASIC. Trends in ASIC design and application, however, indicate an increase in the power consumption for ASIC's, thereby requiring an increase in the current required by such ASIC's during operation.

One method to increase the amount of power received by an ASIC involves increasing the number of solder balls of a 50×50 array configured to carrying power signals to the ASIC. For example, as the power consumption increases for a conventional ASIC having 2500 solder balls in a solder ball array, an increased number of the 2500 solder balls of the array (e.g., greater than 40-50% of the solder balls of the array) can be configured to carry power supply signals from the circuit board to the ASIC. Without increasing the package size (e.g., package body size), such a configuration results in reduction of the overall performance (e.g., relative processing speed) of the ASIC.

Another method to increase the amount of power received by an ASIC involves increasing the number of solder balls of the ASIC solder ball array while maintaining the conventional package size (45 mm×45 mm) for the ASIC. For example, solder balls of a conventional array have a diameter of approximately 0.65 mm. To maintain the package size of the ASIC and increase the number of solder balls associated with the ASIC solder ball array requires a manufacturer to decrease the diameter and pitch of the solder balls of the array. For example, reducing the pitch of the solder balls to 0.8 mm and reducing the solder ball size (e.g., diameter) to 0.5 mm allows a manufacturer to place a greater number of solder balls on a conventional ASIC attachment surface (e.g., an ASIC having a surface area of 2025 mm$^2$). Increasing the number of solder balls of the array allows a manufacturer to utilize the additional solder balls to carry power supply signals from the circuit board to the ASIC while maintaining the number of solder balls carrying data signals between the circuit board and ASIC.

Decreasing the pitch of the solder balls of the ASIC requires a reduction in the size or diameter of the solder balls to maintaining the performance of the ASIC and to minimize solder joints from bridging during the manufacturing process. The reduced solder ball size, however, decreases the strength of the solder ball array (E.G., reduces the thermal fatigue life of the solder balls) and increases the risk of fracture of the solder balls of the array. For example, conventional ASIC packages formed from a ceramic material or substrate, such as silicon, have a coefficient of thermal expansion that is different than the coefficient of thermal expansion of the circuit board material (e.g., fiberglass reinforced polymer resin). Because of the differences in the coefficients of thermal expansion between the ASIC package and the circuit board, the ASIC package and the circuit board expand and contract at different rates when exposed to variations in temperature. During thermal expansion or contraction of the ASIC and the circuit board, such differences in the coefficients of thermal expansion of the ASIC package and the circuit board generate a stress on the solder balls of the array. The stresses induced on the solder balls, as caused by the differences in the expansion rates of the ASIC and the circuit board, can be higher than the failure strength of the smaller-sized solder balls leading to potential fatigue fracturing or failure of the solder balls of the array.

Another method to increase the amount of power received by an ASIC involves increasing the size of the ASIC packaging and increasing the number electrical contacts configured to carrying power signals between the ASIC and a circuit board. Increasing the size of the ASIC packaging allows a manufacturer to add electrical contacts or solder balls to the array (e.g., increase the size of the array) and configure the additional solder balls to carry power supply signals from the circuit board to the ASIC. Such a configuration allows the manufacturer to maintain the number of electrical contacts or solder balls of the array carrying data signals between the circuit board and ASIC and increase the amount of power received by the ASIC.

Increasing the size of the ASIC package, however, increases the weight of the package. Due to the increase in package weight, the amount of weight carried per ball increases. Therefore, the solder balls (e.g., BGA) have an increased susceptibility for collapse that, in turn, leads to a lower solder joint fatigue life. Additionally, increasing the size of the ASIC package, affects the "flatness" of a surface of the ASIC package. When a manufacturer manufactures an ASIC package having dimensions greater than conventional package size (e.g., 45 mm×45 mm), such manufacturing can exceed packaging assembly flatness specifications and, in turn, lead to a curvature or warpage of a surface (e.g., an attachment surface or surface configured to couple to a circuit board) of the package. Warpage of the ASIC packages increases the difficulty of card level assembly. For example, warpage of an ASIC package can create opens or shorts during the assembly process.

By contrast, embodiments of the present invention significantly overcome the described deficiencies and provide mechanisms for providing a power signal to an area array package. An area array device has a grid array of primary electrical contacts coupled to a coupling surface of the device and configured to carry data signals between the area array package and a circuit board. The area array device also has an additional series of secondary electrical contacts coupled to the coupling surface of the device and configured to carry power signals between the area array package and the circuit board. The additional series of secondary electrical contacts provides a relatively large amount of power to the area array package while allowing a manufacturer to maintain the number of primary electrical contacts of the grid array configured to carrying data signals and therefore maintain the overall performance of the area array package.

In one arrangement, an area array package has a substrate having a coupling surface configured to couple to a circuit board. The coupling surface defines a central area and a peripheral area surrounding the central area. The area array package has a grid array of primary electrical contacts coupled to the coupling surface within the central area defined by the coupling surface. The grid array of primary electrical contacts is configured to carry at least data signals between the area array package and a circuit board. The area array package also has a series of secondary electrical contacts coupled to the coupling surface and oriented within the peripheral area defined by the coupling surface. The series of secondary electrical contacts is separate from the grid array and is configured to carry power signals between the area array package and the circuit board.

The series of secondary electrical contacts, for example, increases the overall number of electrical contacts of the area array package (e.g., as compared to a typical number of electrical contacts located on a conventional area array package). The series of secondary electrical contacts, therefore, allow the area array package to receive increased amounts of power during operation (e.g., as compared to conventional area array packages) while maintaining the number of primary electrical contacts of the grid array configured to carrying data signals. Such a configuration maintains the performance or operation speed of area array package requiring relatively large amounts of power for operation.

In one arrangement, the primary electrical contacts of the grid array include a plurality of primary solder balls where each primary solder ball of the grid array defines a first diameter. The series of secondary electrical contacts include a plurality of secondary solder balls where each secondary solder ball of the series defines a second diameter. The second diameter defined by each of the secondary solder balls is greater or larger than the first diameter defined by each of the primary solder balls. The relatively large second diameter of the secondary solder balls allows transmission of a relatively increased amount of power from the circuit board to the area array package, compared to conventional area array packages. The relatively large second diameter of the secondary solder balls and the positioning of the secondary solder balls within the peripheral area defined by the substrate also withstands effects of tolerance stack-up caused by curvature of the electric coupling surface of the substrate.

In one arrangement, the substrate of the area array package defines conductive layers, such as a power plane and a ground plane, and further defines a plated through hole in communication with the power plane and the ground plane. The substrate further carries a contact pad in electrical communication with the plated through hole. The contact pad electrically couples with a secondary electrical contact of the series of secondary electrical contacts. Because the plated through hole electrically contacts the conductive layers of the substrate, during operation the plated through hole provides delivery of the power signal to any conductive layer within the area array package.

In one arrangement, the substrate of the area array package has a power regulation device coupled to the substrate and in electrical communication with the series of secondary electrical contacts. Placement of the power regulation devices on the area array package, as opposed to placement of such devices on a mounting surface of the circuit board, frees an amount of real estate or surface area of the circuit board for use by additional circuit board components or traces. Additionally, placement of the power regulation devices on the area array package reduces an amount of current required to supply power to the package through the secondary electrical contacts. For example, in relating power, current, and voltage, power is directly proportional to both current and voltage (e.g., power=current*voltage). Therefore, to achieve a particular power level, either a relatively small voltage requires a relatively large current or a relatively large voltage requires a relatively small current. Orientation of the regulator on the area array package allows the use of relatively high voltage by the circuit board, thereby lowering the amount of current carried by the secondary electrical contacts. The power regulation devices, in turn, provide relatively low voltage to the package (e.g., as required by the package).

In one arrangement, the series of secondary electrical contacts of the area array package is formed as a plurality of solder balls coupled to the substrate at a pitch of at least approximately 5 mm. Such a pitch spaces the secondary electrical contacts along the substrate to minimizes bridging of power signals between adjacent secondary electrical contacts during operation of the area array package.

In one arrangement, the substrate defines a length of at least approximately 60 mm and a width of at least approximately 60 mm. Such lengths and widths are relatively larger than the lengths and widths of substrates of conventional area array packages (e.g., having lengths of approximately 45 mm and widths of approximately 45 mm). Extension of the length and the width of the substrate beyond the length and width of conventional area array package substrates provide a location for a manufacturer to secure the series of secondary electrical contacts as additional contacts configured to provide power signals to the area array package while maintaining the number, the diameter, and the pitch of primary electrical contacts of the area array package configured to carry data signals.

The features of embodiments of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

DETAILED DESCRIPTION

Embodiments of the present invention provide mechanisms for providing a power signal to an area array package. An area array device has a grid array of primary electrical contacts coupled to a coupling surface of the device and configured to carry data signals between the area array package and a circuit board. The area array device also has an additional series of secondary electrical contacts coupled to the coupling surface of the device and configured to carry power signals between the area array package and the circuit board. The additional series of secondary electrical contacts provides a relatively large amount of power to the area array package while allowing a manufacturer to maintain the number of primary electrical contacts of the grid array configured to carrying data signals and therefore maintain the overall performance of the area array package.

Figure 1:
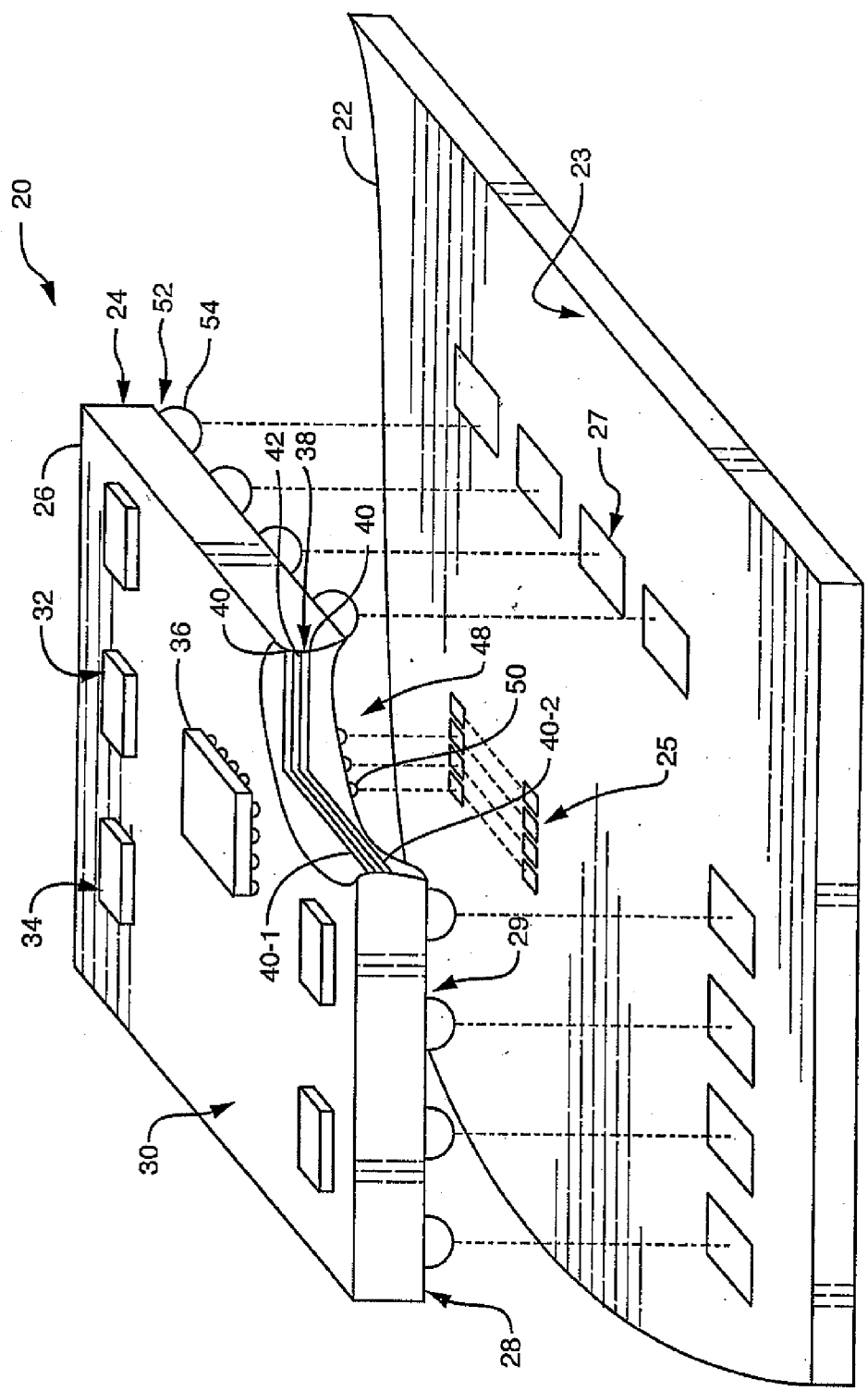
FIG. 1 is a perspective view of a circuit board assembly having an associated area array device, according to one embodiment.

FIG. 1 illustrates an arrangement of a circuit board assembly 20 having a circuit board 22, and an area array package 24 mountable to the circuit board 22.

The circuit board 22, such as formed from a fiberglass material (e.g., a fiberglass reinforced polymer resin) having electrically conductive traces, has a mounting surface 23 having a first set of contact pads 25 and a second set contact pads 27. The first set of contact pads 25 and second set contact pads 27 allow electrical communication between the area array package 24 and the circuit board 22. The first set of contact pads 25 and second set contact pads 27 also provide a location for physical (e.g., mechanical) attachment between the area array package 24 and the circuit board 22. The first set of contact pads 25, in one arrangement, are configured to carry at least data signals between the circuit board 22 and the area array package 24. The second set of contacts 27, in one arrangement, are configured to carry a D.C. current from the circuit board 22 to the area array package 24 to power the area array package 24 during operation of the circuit board assembly 20.

The area array package 24 is formed of a substrate 26 having alternating conductive layers 40 and non-conductive layers 42. For example, conductive layers 40 of the substrate 26 are configured to include a power plane 40-1 and a ground plane 40-2. The area array package 24 defines a primary surface or coupling surface 28 and a secondary surface 30 opposing the primary surface 28. The coupling surface 28 is configured to mount or couple to the mounting surface 23 of the circuit board 22, via electrical contacts 29, to allow communication of data signals and power signals between the area array package 24 and the circuit board 22. The secondary surface 30 is configured to couple with area array package components 32. The area array package components 32 include surface mount technology (SMT) components, such as die 36 (e.g., a flip chip die), and power regulation devices 34.

For example, the power regulation devices 34 include charge to digital converters (CDC's), voltage regulators, capacitors (e.g., decoupling capacitors), or DC-DC converters. In certain cases the circuit board component 24 requires a power signal having a particular voltage. The power regulation devices 34 receive power signals form the circuit board 22 and provide a power signal having an appropriate voltage (e.g., a required voltage) to the area array package 24. Placement of the power regulation devices 34 on the area array package 24, as opposed to placement of such devices 34 on the mounting surface 23 of the circuit board 22, frees an amount of real estate or surface area of the circuit board 22 for use by additional circuit board components or traces.

Additionally, placement of the power regulation devices on the area array package reduces an amount of current required to supply power to the package through the secondary electrical contacts. For example, in relating power, current, and voltage, power is directly proportional to both current and voltage (e.g., power=current*voltage). Therefore, to achieve a particular power level, either a relatively small voltage requires a relatively large current or a relatively large voltage requires a relatively small current. Orientation of the regulator on the area array package allows the use of relatively high voltage by the circuit board, thereby lowering the amount of current carried by the secondary electrical contacts. The power regulation devices, in turn, provide relatively low voltage to the package (e.g., as required by the package).

Figure 2:
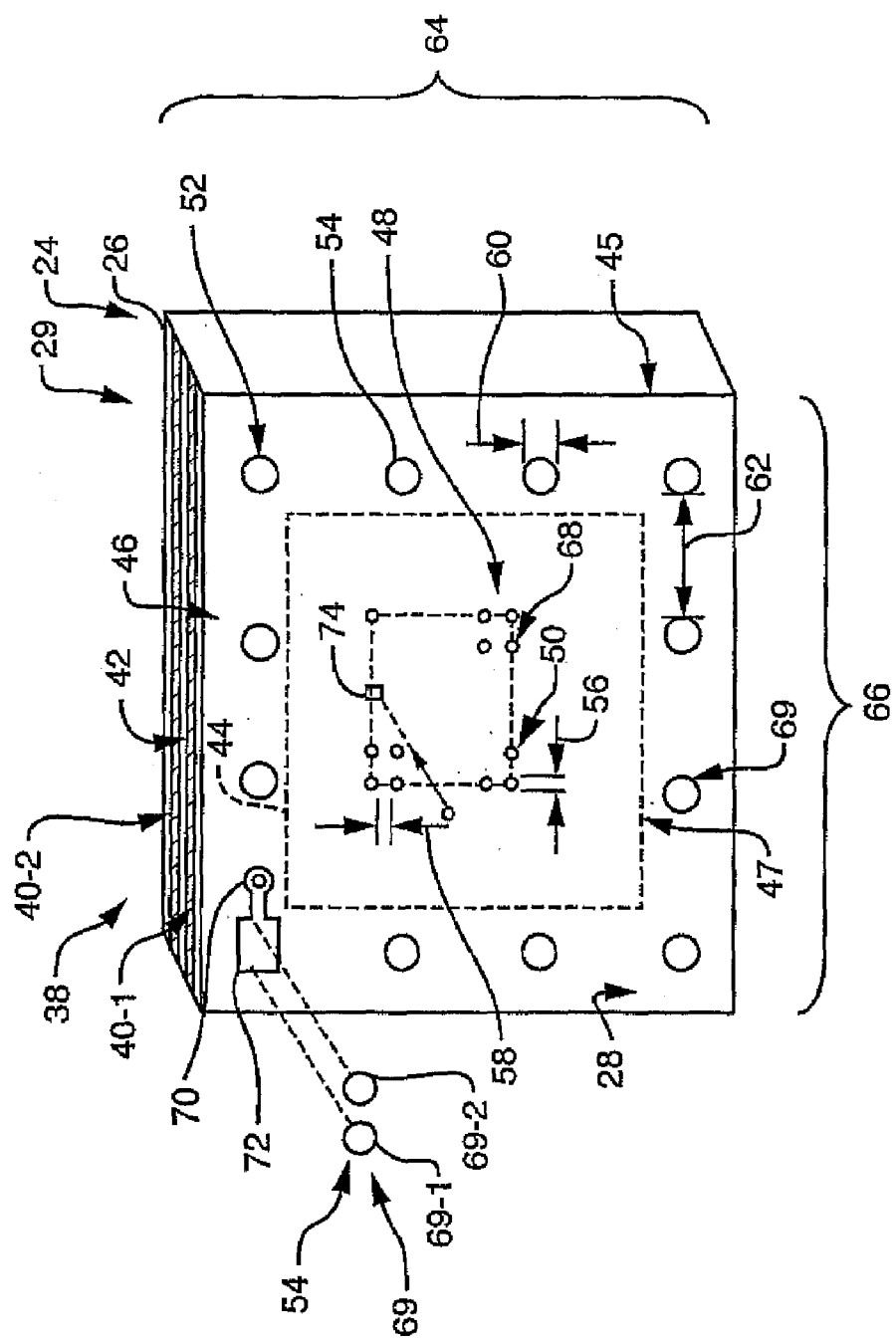
FIG. 2 illustrates a bottom view of the area array device of FIG. 1, according to one embodiment.

FIG. 2 illustrates a view of the coupling surface 28 of the area array package 24. The coupling surface 28 of the area array package 24 has (e.g., defines) a central area 44 and a peripheral area 46 surrounding the central area 44. The peripheral area 46 of the coupling surface 28 orients between a periphery or perimeter 47 defined by the area array package 24 and a boundary 47 defined by the central area 44.

As indicated above, the coupling surface 28 mounts to the circuit board 22 via electrical contacts 29. FIG. 2 illustrates grouping characteristics and orientation of the electrical contacts 29 relative to the coupling surface 28.

As illustrated, the area array package 24 has a grid array 48 of primary electrical contacts 50 coupled to the coupling surface 28 and oriented within the central area 44 defined by the coupling surface 28 (e.g., according to a first grouping characteristic). The grid array 48 of primary electrical contacts 50 is configured to carry, at least, data signals between the area array package 24 and the circuit board 22. For example, during operation, the grid array 48 carries data input signals from the circuit board 22 to the area array package 24, carries data output signals from the area array package 24 to the circuit board 22, and transmits power signals (e.g., critical power and ground returns) between the circuit board 22 and the area array device 24.

The area array device 24 also has a series 52 of secondary electrical contacts 54 coupled to the coupling surface 28 and oriented within the peripheral area 46 defined by the coupling surface 28 (e.g., according to a second grouping characteristic). The series 52 of secondary electrical contacts 54 is configured to carry power signals between the area array package 24 and the circuit board 22.

In one arrangement, the series 52 of secondary electrical contacts 54 increases a number of electrical contacts of the area array package 24, as compared to a typical number of electrical contacts located on a conventional area array package. For example, conventional grid arrays have an array pattern of 50 columns having 50 electrical contacts (e.g., solder balls) per column. Such an array or grid configuration (50×50) results in the conventional grid array having a total of 2500 electrical contacts. In the present case, assume the grid array 48 includes 2500 electrical contacts 50. The series 52 of secondary electrical contacts 54 provide additional electrical contacts for the area array package 24 such that the total number of electrical contacts 29 of the area array package 24 (e.g., the sum of the number primary electrical contacts 50 and the number of secondary electrical contacts 54) is greater than 2500, for example.

As indicated above, the series 52 of secondary electrical contacts 54 is configured to carry power signals from the circuit board 22 to the area array package 24. Because the series 52 of secondary electrical contacts 54 increases the overall number of electrical contacts 29 configured to carry power to the area array package 24 (e.g., relative to and beyond that carried by conventional area array packages), the series 52 of secondary electrical contacts 54 allows the area array package 24 to receive an increased amount of power from the circuit board 22, relative to conventional area array packages. Therefore, as the power consumption requirements for certain area array packages increase, configuring the area array package 24 with the series 52 of secondary electrical contacts 54 allows the area array packages 24 to receive increased amounts of power during operation, relative to conventional area array packages.

The use of the series 52 of additional secondary electrical contacts 54, furthermore, allows a manufacturer to increase the amount of power received by the area array package 24 while maintaining the number of primary electrical contacts 50 of the grid array 48 configured to carrying data signals. As indicated above, as the power consumption increases for a conventional area array package having a grid array with 2500 electrical contacts, a manufacturer can configure an increased number of the 2500 electrical contacts (e.g., greater than 40-50% of the electrical contacts of the array) to carry power signals from the circuit board to the area array package. As a result, the number of remaining electrical contacts of the array configured to carry data signals between the area array package and the circuit board decreases, thereby reducing the overall performance (e.g., relative processing speed) of the conventional area array package. In one arrangement, the series 52 of secondary electrical contacts 54 provide an additional number of electrical contacts 29 to the area array package (e.g., the area array package 24 has a total number of electrical contacts greater than 2500 for example) configured to transfer an increased amount of power from the circuit board 22 to the area array package 24, compared to typical area array packages. Use of the series 52 of secondary electrical contacts 54, therefore, allows a manufacturer to provide additional power signals to the area array package 24 while maintaining the number of primary electrical contacts 50 of the grid array 48 configured to carry data signals, thereby maintaining the overall performance of the area array package 24.

FIG. 2 also illustrates an orientation of the electrical contacts of the area array package 24. The series 52 of secondary electrical contacts 54 of the area array package 24, in one arrangement, is configured as a separate and distinct set of electrical contacts relative to the primary electrical contacts 50 of the grid array 48. For example, as illustrated in FIG. 2, the central area 44 defined by the substrate 26 groups the grid array 48 of primary electrical contacts 50 into a first group of electrical contacts (e.g., having a first grouping characteristic, such as a square array pattern). The peripheral area 46 defined by the substrate 26 groups the series 52 of secondary electrical contacts 54 into a second group of electrical contacts (e.g., having a second grouping characteristic, such as a square frame pattern), separate from the first group of electrical contacts. In one arrangement, such grouping of the series 52 of secondary electrical contacts 54 (e.g., within the peripheral area 46) distinguishes the series 52 of secondary electrical contacts 54 from the grouping of the primary electrical contacts 50 of the grid array 48 (e.g., within the central area 44) such that the secondary electrical contacts 54 do not form part of the grid array 48.

FIG. 2 also illustrates details of a configuration of the substrate 26, the electrical coupling surface 28, the primary electrical contacts 50, and the secondary electrical contacts 54 of the area array package 24.

The electrical contact surface 28 of the area array package 24 includes contact pads that provide attachment locations for the primary electrical contacts 50 of the grid array 48 and for the secondary electrical contacts 54 of the series 52. For example, each of the primary electrical contacts 50 of the grid array 48 couple to corresponding contact pads 74 oriented within the central area 44 defined by the electrical contact surface 28. In one arrangement, the contact pads 74 are configured as approximately 20 mil pads oriented at a pitch of approximately 1 mm. Additionally, each of the secondary electrical contacts 54 couple to corresponding contact pads 72 oriented within the peripheral area defined by the electrical contact surface 28. In one arrangement, the contact pads 72 are configured as approximately 40 mil pads oriented at a pitch of approximately 5 mm. Orientation of the contact pads 72 at the approximate 5 mm pitch, in turn, orients each of the secondary electrical contacts 54 coupled to the contact pads 72 at an approximate 5 mm pitch. Such a pitch spaces the secondary electrical contacts 54 to minimizes bridging of power signals between adjacent secondary electrical contacts 54 during operation of the area array package 24.

In one arrangement, the contact pads 72 (e.g., the pads 72 configured to secure and provide electrical communication between the substrate 26 and the secondary electrical contacts 54) electrically couple with a plated through hole or plated via 70 defined by the substrate 26 to form a "dog bone" configuration. The plating of the plated through hole forms an electrical communication among the conductive layers 40 of the substrate 26 (e.g., the power planes 40-1 and the ground planes 40-2 of the substrate 26). During operation for example, the circuit board 22 transmits a power signal to the area array package 24 through the secondary electrical contacts 54. As the power signal travels to a secondary electrical contact 54, the secondary electrical contact 54 transmits the signal to the pad 72 and to the plated through hole 70. Because the plated through hole 70 electrically contacts the conductive layers 40 of the substrate 40, during operation the plated through hole 70 delivers the power signal to any conductive layer 40 within the area array package 24.

In one arrangement, the substrate 26 of the area array package 24 defines a length 64 and a width 66. Substrates of conventional area array packages have lengths of approximately 45 mm and widths of approximately 45 mm. In the area array package 24, as shown in FIG. 2, the length 64 and width 66 of the substrate 26 are relatively larger than the lengths and widths of substrates of conventional area array packages. In one arrangement, the length 64 defined by the substrate is approximately 60 mm and the width 66 defined by the substrate is approximately 60 mm. The length 64 defined by the substrate can also be greater than approximately 60 mm and the width 66 defined by the substrate can also be greater than approximately 60 mm. Extension of the length 64 and the width 66 of the substrate 26 beyond the length and width of conventional area array package substrates, for example, defines the peripheral area 44 of the electrical coupling surface 28. The additional length 64 and width 66 of the substrate 26, compared to conventional area array package substrates, provide a location for a manufacturer to secure the additional series 52 of secondary electrical contacts 54 to the area array package 24, thereby increasing the amount of power received by the area array package 24 while maintaining the number of primary electrical contacts 50 of the grid array 48 configured to carry data signals.

In one arrangement, the primary electrical contacts 50 and the secondary electrical contacts 54 are configured as solder balls (e.g., the area array package 24 is configured as a BGA package). The relative diameter of the solder balls of the grid array 48 or the series 52 depends upon the location of the solder balls on the coupling surface 28 of the substrate 26 (e.g., location within either the central area 44 or the peripheral area 46 defined by the substrate 26). For example, the primary electrical contacts 50 of the grid array 48 orient within the central area 44 of the substrate 26 and include primary solder balls 68, each solder ball 68 having a first diameter 56. Furthermore, the secondary electrical contacts 54 of the series 52 orient within the peripheral area 46 defined by the substrate 26 and include secondary solder balls 69, each secondary solder ball 69 having a second diameter 60.

As indicated in FIG. 2, the second diameter 60 defined by each of the secondary solder balls 69 is larger or greater than the first diameter 56 defined by each of the primary solder balls 68. For example, the first diameter 56 of each of the primary solder balls 68 is approximately 25 mil or 0.6 mm (e.g., typically used in conventional area array packages) while the second diameter 60 of each of the secondary solder balls 69 is approximately 0.65 mm. The relatively large second diameter 60 of the secondary solder balls 69 allows transmission of a relatively increased amount of power from the circuit board 22 and the area array package 24, compared to conventional area array packages. Additionally, the larger second diameter 60 of each of the secondary solder balls 69, relative to the first diameter 56 of each of the primary solder balls 68, allows the area array package 24 to withstand effects of tolerance stack-up on the secondary solder balls 69 caused by curvature of the electric coupling surface 28 of the substrate 26.

As indicated above, the length 64 and width 66 of the substrate 26 are relatively larger than the lengths and widths of substrates of conventional area array packages. As indicated above, when a manufacturer manufactures an area array package (e.g., substrate) having larger-than-conventional dimensions, such manufacturing can exceed packaging assembly flatness specifications and, in turn, lead to a curvature of a surface of the substrate. When an assembler attaches a curved substrate surface to a circuit board using a solder reflow process, for example, the curvature of the surface of the substrate creates a tolerance stack-up and causes the outer most solder contacts of the package (e.g., the solder contacts oriented nearest to the perimeter of the package) to absorb a greater amount of package weight compared to the inner solder contacts of the package. For the area array package 24 illustrated by FIG. 2, because the secondary solder balls 69 are configured as relatively large (e.g., having a diameter 60 larger than the diameter 56 of the primary or conventional solder balls 68) the secondary solder balls 69 absorb any increased weight of the package 24 relative to the circuit board 22 and as caused by the curvature of the substrate 26, thereby minimizing collapse or failure of the secondary solder balls 69 after assembly.

FIG. 2 also illustrates formation of the relatively large second diameter 60 of the secondary solder balls 69. During the assembly process, a manufacturer applies two solder balls 69-1, 69-2 to the contact pad 72. For example, each of the solder balls 69-1, 69-2 defines a diameter of approximately 25 mil or 0.6 mm. The manufacturer then heats the solder balls 69-1, 69-2 to a melting temperature, thereby causing the solder of the solder balls 69-1, 69-2 to reflow and form a single solder ball 69 on the pad 72. For example, after reflow, the solder balls 69-1, 69-2 form a single solder ball 69 having an approximate, central 20 mil height and a diameter of approximately 49 mil or 1.0 mm.

Figure 3:
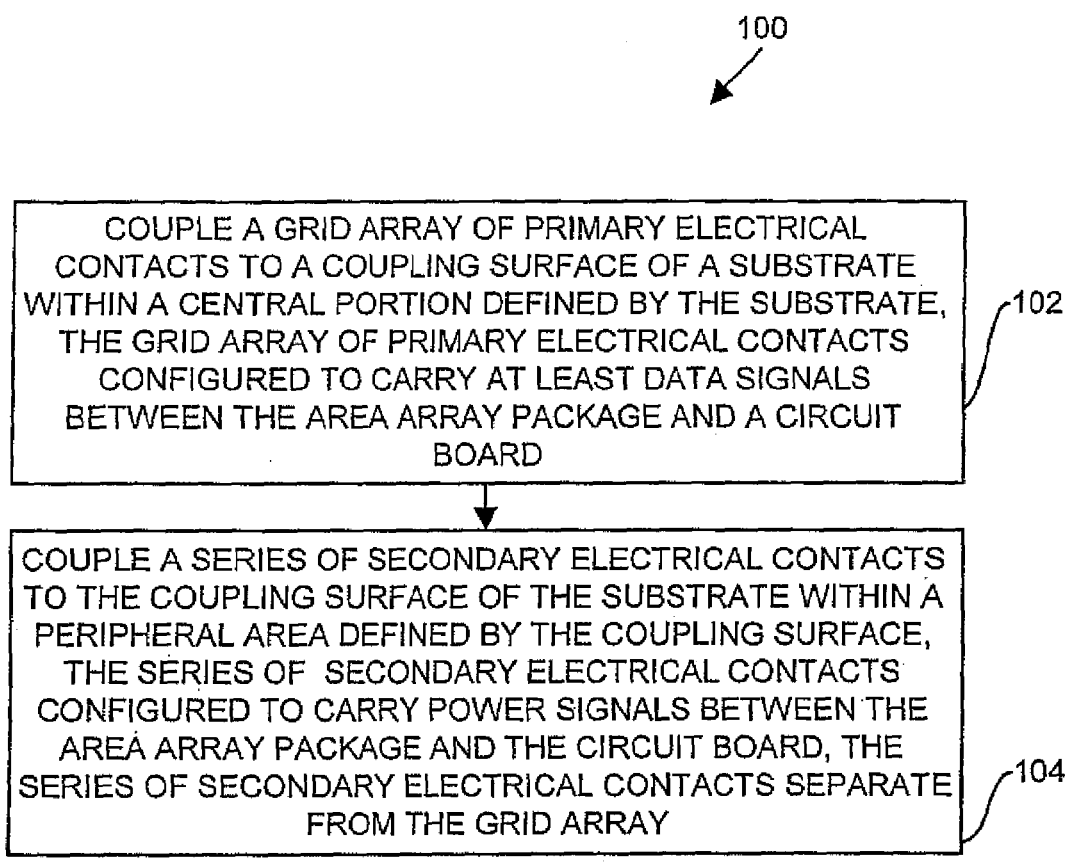
FIG. 3 is a flow chart showing a method for assembling an area array device, according to one embodiment.

FIG. 3 illustrates a method 100 for assembling an area array package 24. Such a method can be performed either manually (e.g., by a technician on an assembly line) or automatically (e.g., by automated equipment).

In step 102, an assembler couples a grid array 48 of primary electrical contacts 50 to a coupling surface 28 of a substrate 26 within a central portion 44 defined by the substrate, the grid array 48 of primary electrical contacts 50 configured to carry at least data signals between the area array package 24 and a circuit board 22.

In step 104, the assembler couples a series 52 of secondary electrical contacts 54 to the coupling surface 28 of the substrate 26 within a peripheral area 46 defined by the coupling surface 28, the series 52 of secondary electrical contacts 54 configured to carry power signals between the area array package 24 and the circuit board 22, the series 52 of secondary electrical contacts 54 separate from the grid array 48.

As indicated above, coupling the series 52 of additional secondary electrical contacts 54 allows the assembler or manufacturer to increase the amount of power received by the area array package 24 while maintaining the number of primary electrical contacts 50 of the grid array 48 configured to carrying data signals. The series 52 of secondary electrical contacts 54, therefore, allows a manufacturer to provide additional power signals (e.g., an increase in power) to the area array package 24 while maintaining the overall performance of the area array package 24.

In one arrangement, the assembler forms the primary electrical contacts 50 of the grid array 48 as a plurality of primary solder balls 68, each primary solder ball 68 of the grid array 48 defining a first diameter 56. The assembler also forms the series 52 of secondary electrical contacts 54 as a plurality of secondary solder balls 69, each secondary solder ball 69 of the series 52 defining a second diameter 60, the second diameter 60 defined by each of the secondary solder balls 69 being greater or larger than the first diameter 56 defined by each of the primary solder balls 68. The relatively large second diameter 60 of the secondary solder balls 69 allows transmission of a relatively increased amount of power from the circuit board 22 and the area array package 24, compared to conventional area array packages.

Those skilled in the art will understand that there can be many variations made to the embodiments explained above while still achieving the same objective of those embodiments and the invention in general.

For example, as indicated above, the area array package 24 is configured as a BGA device such that the primary electrical contacts 50 and the secondary electrical contacts 54 are formed as solder balls. Such description is by way of example only. In one arrangement, the area array package 24 is configured as ceramic column grid array (CCGA) having solder columns as the primary electrical contacts 50 and the secondary electrical contacts 54.

In another example, as indicated above, the second set of contacts 27, in one arrangement, are configured to carry a D.C. current from the circuit board 22 to the area array package 24 to power the area array package 24 during operation of the circuit board assembly 20. In another arrangement, the second set of contacts 27 are configured to carry multiple power supply signals (e.g., 1 V, 3.3 V, 5.0 V, etc.).

As indicated above, the series 52 of secondary electrical contacts 54 increases a number of electrical contacts of the area array package 24, as compared to a typical number of electrical contacts located on a conventional area array package. Such description is by way of example only. In another arrangement, the sum of the number of primary electrical contacts 50 and the number of secondary electrical contacts 54 maintains or reduces the number of electrical contacts of the area array package 24, as compared to a typical number of electrical contacts located on a conventional area array package. For example, as indicated above, the size of the package 24 is configured as larger than the size of a conventional area array package. The larger size of the package 24 allows an increase in the diameter of each secondary electrical contact 54. In turn, the increased size of each secondary electrical contact 54 allows transmission of a relatively larger current from the circuit board 22 to the package 24. As such, a manufacturer can maintain the number of primary electrical contacts 50 (e.g., each primary electrical contact 50 being configured to carry a data signal) or decrease the number of primary electrical contacts 50 (e.g., the secondary electrical contacts 54 configured to transmit substantially all power signals, thereby reducing the necessity for the secondary electrical contacts 54 to also carry power signals) associated with the package 24.

As indicated above, in one arrangement, the contact pads 72 are configured as approximately 40 mil pads oriented at a pitch of approximately 5 mm. Such an arrangement is provided by way of example only. In another arrangement, the contact pads 72 are oriented at a pitch of greater than 5 mm.

In FIG. 1, the contact pads 27 are illustrated as square or rectangular pads. Such illustration is by way of example only. A manufacturer can configure the shape of the pads in any geometrical arrangement (e.g., circular, triangular, etc.).

Such variations are intended to be covered by the scope of embodiments of the invention. As such, the foregoing description of embodiments of the invention is not intended to be limiting. Rather, any limitations to the invention are presented in the following claims.

What is claimed is:

1. A method for manufacturing an area array package comprising:

coupling a grid array of primary electrical contacts to a coupling surface of a substrate within a central portion defined by the substrate, the grid array of primary electrical contacts configured to carry at least data signals between the area array package and a circuit board;

forming the primary electrical contacts of the grid array as a plurality of primary solder balls, each primary solder ball of the grid array defining a first diameter;

coupling a series of secondary electrical contacts to the coupling surface of the substrate within a peripheral area defined by the coupling surface, the series of secondary electrical contacts configured to carry power signals between the area array package and the circuit board, the series of secondary electrical contacts separate from the grid array; and forming the series of secondary electrical contacts as a plurality of secondary solder balls, each secondary solder ball of the series defining a second diameter, the second diameter defined by each of the secondary solder balls being greater than the first diameter defined by each of the primary solder balls;

wherein coupling the series of secondary electrical contacts comprises coupling the series of secondary electrical contacts to the coupling surface of the substrate, the coupling surface configured to oppose a mounting surface of the circuit board, the substrate having at least one power plane, at least one ground plane, at least one plated through hole in communication with the at least one power plane, and at least one plated through hole in communication with the ground plane;

the substrate having a contact pad in electrical communication with the at least one plated through hole in communication with the at least one power plane and electrically coupled with a secondary solder ball of the series of secondary electrical contacts;

the substrate having a contact pad in electrical communication with the at least one plated through hole in communication with the at least one ground plane and electrically coupled with a secondary solder ball of the series of secondary electrical contacts;

the secondary solder ball, contact pad, and the at least one plated through hole in communication with the at least one power plane configured to carry power to the at least one power plane through the coupling surface; and the secondary solder ball, contact pad, and the at least one plated through hole in communication with the at least one ground plane configured to carry power from the at least one ground plane through the coupling surface;

further comprising:

forming the substrate having a length that is greater than 45 mm and having a width that is greater than 45 mm:

coupling the grid array of primary electrical contacts to the coupling surface of the substrate comprises coupling the grid array of primary electrical contacts to the coupling surface of the substrate in an array pattern of 50 columns having 50 primary electrical contacts per column within the central portion defined by the substrate, the grid array of primary electrical contacts configured to carry data signals between the area array package and a circuit board; and coupling the series of secondary electrical contacts to the coupling surface of the substrate comprises coupling the series of secondary electrical contacts to the coupling surface of the substrate within the peripheral area defined by the coupling surface, the series of secondary electrical contacts configured to carry power signals between the area array package and the circuit board, the series of secondary electrical contacts being separate from the grid array of primary electrical contacts and a sum of the primary electrical contacts and the secondary electrical contacts being greater than 2500 electrical contacts.

2. The method of claim 1 wherein the step of forming the series of secondary electrical contacts comprises:
   placing at least two solder balls on a contact pad oriented within the peripheral area defined by the coupling surface, each solder ball defining a first diameter;
   heating the at least two solder balls to cause the solder to undergo reflow;
   forming a secondary solder ball on the contact pad, secondary solder ball defining a second diameter, the second diameter defined by the secondary solder ball being greater than the first diameter defined by each of the primary solder balls.

3. The method of claim 1 comprising coupling at least one power regulation device to the substrate and in electrical communication with the series of secondary electrical contacts.

4. The method of claim 1 comprising coupling the plurality of secondary solder balls to the substrate at a pitch of at least approximately 5 mm.

5. The method of claim 1 wherein the substrate defines a length of at least approximately 60 mm and a width of at least approximately 60 mm.

6. The method of claim 1 wherein the grid array of primary solder balls is configured in an array pattern of 50 columns having 50 primary solder balls per column.

7. The method of claim 1 further comprising surface mounting a die to a second surface of the substrate, the second surface of the substrate opposing the coupling surface of the substrate, to electrically couple the die with the first set of contact pads and the second set of contact pads wherein the die is configured to exchange, through second surface of the substrate, at least data signals with the circuit board through the grid array of primary electrical contacts and wherein the die is configured to exchange, through second surface of the substrate, power signals with the circuit board via the at least one secondary solder ball, the at least one contact pad, and the at least one plated through hole.

8. The method of claim 1, wherein coupling the grid array of primary electrical contacts to the coupling surface of the substrate within the central portion defined by the substrate, the grid array of primary electrical contacts configured to carry at least data signals between the area array package and the circuit board comprises coupling the grid array of primary electrical contacts to the coupling surface of the substrate within the central portion defined by the substrate, the grid array of primary electrical contacts configured to carry data signals and power signals between the area array package and the circuit board.

9. The method of claim 1, wherein forming the substrate having the length that is greater than 45 mm and having the width that is greater than 45 mm comprises forming the substrate having a length that is substantially equal to 60 mm and having a width that is substantially equal to 60 mm.

10. The method of claim 1, comprising:
   providing the substrate having the coupling surface, the coupling surface configured to oppose the mounting surface of the circuit board and the coupling surface being curved relative to the mounting surface of the circuit board; and
   sizing the second diameter defined by the solder balls of the plurality of secondary solder balls relative to the first diameter of the primary solder balls to configure the secondary solder balls to absorb a greater amount of weight of the area array package, caused by curvature of the coupling surface of the substrate, than the primary solder balls.

* * * * *